US012500086B2

(12) United States Patent
Schulze et al.

(10) Patent No.: US 12,500,086 B2
(45) Date of Patent: Dec. 16, 2025

(54) METHOD OF MANUFACTURING A METAL SILICIDE LAYER ABOVE A SILICON CARBIDE SUBSTRATE, AND SEMICONDUCTOR DEVICE COMPRISING A METAL SILICIDE LAYER

(71) Applicant: Infineon Technologies AG, Neubiberg (DE)

(72) Inventors: Hans-Joachim Schulze, Taufkirchen (DE); Florian Markus Grasse, St. Stefan im Gailtal (AT); Moriz Jelinek, Villach (AT); Axel König, Villach (AT); Gregor Langer, Wölfnitz (AT); Bernhard Leitl, Klagenfurt (AT); Kristijan Luka Mletschnig, Klagenfurt (AT); Werner Schustereder, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 459 days.

(21) Appl. No.: 18/090,673

(22) Filed: Dec. 29, 2022

(65) Prior Publication Data
US 2023/0215729 A1    Jul. 6, 2023

(30) Foreign Application Priority Data

Jan. 3, 2022  (DE) ................. 102022100072.9

(51) Int. Cl.
| H01L 21/04 | (2006.01) |
| H01L 21/265 | (2006.01) |
| H10D 62/10 | (2025.01) |
| H10D 64/62 | (2025.01) |
| H10D 62/40 | (2025.01) |
| H10D 62/832 | (2025.01) |

(52) U.S. Cl.
CPC .... H01L 21/0485 (2013.01); H01L 21/26513 (2013.01); H10D 62/10 (2025.01);
(Continued)

(58) Field of Classification Search
CPC ........... H01L 21/0485; H01L 21/26513; H01L 21/046; H01L 21/26506; H01L 21/268;
(Continued)

(56) References Cited

U.S. PATENT DOCUMENTS 5,980,265 A * 11/1999 Tischler .............. H01L 21/0485
438/93
6,770,508 B2 * 8/2004 Nakashima ......... H01L 21/0485
438/105
(Continued)

FOREIGN PATENT DOCUMENTS

| DE | 102006050360 B4 | 5/2014 |
| JP | H0799169 A | 4/1995 |
| JP | 201755005 A | 3/2017 |

OTHER PUBLICATIONS

Andrian V. Kuchuk, et al., "The Formation Mechanism of Ni-based Ohmic Contacts to 4H—n—SiC", Materials Science Forum vols. 717-720, 2012, pp. 833-836.
(Continued)

*Primary Examiner* — Syed I Gheyas
(74) *Attorney, Agent, or Firm* — Cooper Legal Group LLC (57) ABSTRACT

A method of manufacturing a metal silicide layer comprises performing laser thermal annealing of a surface region of a silicon carbide (SiC) substrate, exposing a surface of a thus obtained silicon layer, depositing a metal layer above the exposed silicon layer, and/or thermally treating a stack of layers, comprising the silicon layer and the metal layer, to form a metal silicide layer. Alternatively and/or additionally, the method may comprise depositing a silicon layer above a SiC substrate, depositing a metal layer, and/or performing laser thermal annealing of the SiC substrate and a stack of layers above the SiC substrate to form a metal silicide layer, wherein the stack of layers comprises the silicon layer and
(Continued)

the metal layer. Moreover, a semiconductor device is described, comprising a SiC substrate, a metal silicide layer, and a polycrystalline layer in direct contact with the SiC substrate and the metal silicide layer.

20 Claims, 4 Drawing Sheets (52) U.S. Cl.
CPC .............. H10D 64/62 (2025.01); *H10D 62/40* (2025.01); *H10D 62/8325* (2025.01)

(58) Field of Classification Search
CPC ........ H10D 62/10; H10D 64/62; H10D 62/40; H10D 62/8325; H10D 8/00; H10D 30/60; H10D 64/01
See application file for complete search history.

(56) References Cited

U.S. PATENT DOCUMENTS

| | | | |
|---|---|---|---|
| 7,829,416 B2 | 11/2010 | Kudou et al. | |
| 9,129,804 B2 | 9/2015 | Tamaso | |
| 2010/0075474 A1 | 3/2010 | Kudou et al. | |
| 2012/0164765 A1* | 6/2012 | Slater, Jr. | H10H 20/01 |
| | | | 438/662 |
| 2014/0170841 A1 | 6/2014 | Tamaso | |
| 2019/0308274 A1* | 10/2019 | Roesner | C30B 33/00 |

OTHER PUBLICATIONS

A. Kuchuk, et al., "Fabrication and characterization of nickel silicide ohmic contacts to n-type 4H silicon carbide", Journal of Physics: Conference Series 100, 2008.
Insung Choi, et al., "Laser-induced phase separation of silicon carbide", Nature Communications; 7 Pgs; Nov. 30, 2016; http://www.nature.com/naturecommunications.
G. Ottaviani, et al., "Barrier heights and silicide formation for Ni, Pd, and Pt on silicon", Department of Materials Science, Cornell University, Ithaca, NY 14853; vol. 24, No. 6; Sep. 15, 1981; 6 Pgs.
Kazuhiro Ito, et al.; "Simultaneous Formation of Ni/Al Ohmic Contacts to Both n- and p-Type 4H—SiC"; Journal of Electronic Materials, vol. 37, No. 11, 2008; 7 Pgs.
Hossein Elahipanah; "A Wafer-Scale Ni-Salicide Contact Technology on n-Type 4H—SiC"; ECS Journal of Solid State Science and Technology, 6 (4) p. 197-p. 200 (2017).

* cited by examiner

METHOD OF MANUFACTURING A METAL SILICIDE LAYER ABOVE A SILICON CARBIDE SUBSTRATE, AND SEMICONDUCTOR DEVICE COMPRISING A METAL SILICIDE LAYER

RELATED APPLICATION

This application claims priority to German Patent Application No. 102022100072.9, filed on Jan. 3, 2022, entitled "METHOD OF MANUFACTURING A METAL SILICIDE LAYER ABOVE A SILICON CARBIDE SUBSTRATE, AND SEMICONDUCTOR DEVICE COMPRISING A METAL SILICIDE LAYER", which is incorporated by reference herein in its entirety.

TECHNICAL FIELD

The present disclosure generally relates to methods of manufacturing metal silicide layers above a silicon carbide (SiC) substrate and a semiconductor device comprising such a metal silicide layer.

BACKGROUND

Metal silicide layers are known as contact materials having good Ohmic properties in semiconductor devices. For example, a nickel-silicon alloy layer whose nickel composition is at specific atomic-% is formed on an n-type silicon carbide (SiC) substrate by a vapor deposited sputtering method, followed by an annealing treatment (e.g., an annealing treatment by Shinji et al. in Japanese Patent Application JP-H-0799169A published on Apr. 4, 1995, which is incorporated herein by reference in its entirety).

An alternative fabrication of nickel silicide contacts on n-type 4H SiC has been described using a self-aligned ("salicide") process (e.g., Kuchuk et al, Fabrication and characterization of nickel silicide ohmic contacts to n-type 4H Silicon Carbide. 2008, J. Phys.: Conf. Ser. 100 042003, <DOI: 10.1088/1742-6596/100/4/042003>, which is incorporated herein by reference in its entirety). Salicide processes are described in microelectronic industry to directly form electrical contacts between a semiconductor device and metal contacts provided thereon. The process involves the reaction of a metal thin film with silicon in the surface region of a silicon containing semiconductor substrate or within the active regions of a semiconductor device, e.g., transistors, diodes, or power MOFSETs. The thus formed low-resistance metal silicide layer at the interface of the semiconductor substrate can be used as silicide contacts. Contrary to the sputtering methods, the contact formation using the salicide process usually does not need photolithographic patterning processes.

The generation of Ohmic contacts at the interface of SiC substrates and metal contact layers require a relative high temperature in the post-metallization annealing step and formation of strong oriented growth of NiSi grains at the interface of the semiconductor substrate and the metal silicide layer (cf. Kuchuk et al., The Formation Mechanism of Ni-based Ohmic Contacts to 4H-n-SiC. 2012, Materials Science Forum, Vols. 717-720, pp 833-836, <DOI: 10.4028/www.scientific.net/msf.717-720.833, which is incorporated herein by reference in its entirety). However, the post-metallization annealing step sometimes causes carbon-grains within the metal silicide layer or intermediate carbon layer formation at the surface or the SiC interface, e.g., carbide layers, and, thus, loss of Ohmic contact behavior at the interface of the semiconductor layer and the metal contact layer due to recrystallization processes and a delamination of the metal contact layers. Therefore, additional steps are conventionally carried out which increase the costs for producing Ohmic contacts on semiconductors, especially, on SiC substrate-based semiconductors.

In the light of the above, there is a demand to provide alternative manufacturing processes for metal silicide layers in SiC based semiconductor devices, which enable the production of contacts, suitably with Ohmic behavior, in an efficient and cost sensitive manner. Furthermore, there is a need of providing semiconductor SiC based devices having reliable contacts with good homogeneity and reproducibility.

SUMMARY

Some embodiments relate to methods of manufacturing a metal silicide layer above a silicon carbide (SiC) substrate. The method comprises performing laser thermal annealing of a surface region of the SiC substrate (e.g., the laser thermal annealing may be performed after having provided the SiC substrate). Performing the laser thermal annealing splits SiC material, in the surface region of the SiC substrate, into a polycrystalline SiC layer, a silicon layer above the polycrystalline SiC layer, and a carbon layer above the silicon layer. The method comprises removing at least some carbon material of the carbon layer to expose a surface of the silicon layer. In some examples, at least most parts of the carbon material of the carbon layer may be removed to expose the surface of the silicon layer. The term "most parts" does mean that most of (e.g., more than half of) the carbon material of the carbon layer is removed or substantially all of the carbon material of the carbon layer is removed, and the silicon layer is exposed by this removal act (in most of its parts, for example). The thus obtainable low content of remaining carbon in a layer stack above the SiC substrate may reduce the generation of carbon-grains during later processing acts such as thermal processing and/or annealing acts.

The method may comprise depositing a metal layer above the silicon layer (e.g., the metal layer may be deposited above the exposed surface of the silicon layer) to form a stack of layers comprising the silicon layer and the metal layer, and thermally treating the stack of layers. By thermally treating the silicon and metal layers, a metal silicide layer is formed which comprises a metal silicide made from metal of the metal layer and silicon of the silicon layer. In some examples, silicon from which the metal silicide of the metal silicide layer is formed is mostly made up of the silicon of the silicon layer (e.g., at least half of the silicon that reacts to form the metal silicide of the metal silicide layer is from the silicon layer). Decomposition of the SiC layer and forming a silicide using the, thus, generated silicon is possible in some circumstances, but it is not preferred as the content of free carbon is increased by this decomposition reaction. Moreover, consumption of SiC material from the substrate can thereby be minimized or avoided so that homogeneity of the produced semiconductors from device to device can be achieved. Especially, spreads in substrate thicknesses from wafer to wafer can be lowered if the consumption of SiC material is minimized Therefore, the silicon layer, for instance, is adjusted to be thick enough to deliver enough silicon material for the silicide formation during the silicide reaction.

The SiC substrate may comprise or consist of at least one of a SiC wafer or one or more epitaxial layers (e.g., n-type SiC epitaxial layers). The epitaxial layers may comprise epitaxial structures, which, for instance, may be provided within or on a surface region of the one or more epitaxial layers and/or the SiC wafer. For example, the substrate may comprise only epitaxial layers and may be devoid of a SiC wafer. For example, a wafer that has been used for epitaxial growth might have been removed in previous process acts. In another example, a SiC wafer may at least partly be present in the substrate, for example at the rear side of the SiC substrate, while one or more epitaxial layers are provided thereon at the front side of the SiC substrate. Then, the SiC substrate which shall be provided with contacts can be the SiC wafer at the rear side thereof. For example, the method as describe herein can be used for providing metal silicide contacts at the front side epitaxial layer(s) of the substrate. Even though this specification mostly refers to methods for contacting the rear side semiconductor surface with metal silicide layers, it can be used for providing front side and/or rear side contacts in, for example power metal-oxide-semiconductor field effect transistors (MOSFETs), SiC based diodes, or junction-gate field effect transistors (J-FETs). The terms "front side" and "rear side" (also known as "back side") are used with reference to the orientation in the examples shown in the drawing section. Because components of embodiments can be positioned in several different orientations, the directional terminology is used for purposes of illustration only and shall in no way considered to be limiting.

In this specification, the term "above" does mean that a first layer is above the surface of a substrate or a second layer. Thereby the first layer may be directly on the substrate or the second layer or may extend directly onto another layer or elements, or intervening layers or elements may also be present. In contrast, when a layer or an element is referred to as being "directly on" or extending "directly onto" another layer or element, there are no intervening layers or elements present.

Laser thermal annealing (LTA) is a thermal treatment of at least the SiC substrate surface using laser beams with high energy (e.g., energy higher than a threshold energy) in this embodiment, thereby typically causing epitaxial rearrangements in the SiC substrate so that a polycrystalline layer is generated near the surface of the SiC substrate treated. In some examples, this polycrystalline layer is a 3C—SiC layer. Generally, the laser thermal annealing process results in a substrate structure with a monocrystalline SiC substrate layer, a crystalline or polycrystalline SiC layer, a silicon layer (e.g., the silicon layer may be polycrystalline), and a top carbon layer. This epitaxial rearrangements at suitable energy densities can be described as a sublimation-like phase transition process, in which the crystalline structure of SiC is decomposed, and the components are separated (at the same time, for example). This generally results in the specific layer stack with a polycrystalline SiC layer on which a thin silicon layer and a thin carbon layer of the decomposed SiC substrate structure are formed. The resulting stack of layers has the advantages that a polycrystalline SiC phase has been generated and may have a low band gap (e.g., a band gap lower than a threshold band gap) due to the 3C—SiC formation. The low band gap may be sufficient for generating an Ohmic contact with low electric resistivity. In addition, the thin silicon layer above the polycrystalline layer allows a self-aligning silicide formation of silicon material contained therein at lower temperatures compared to SiC materials in the substrate or SiC layers during the following thermal treatment procedures.

Exposing a surface of the silicon layer means in the context of this application that the carbon layer and any intermittent layer generated above the surface of the silicon layer, for example, during the heat annealing of the SiC substrate, may be removed in at least some parts. To improve reliability of the obtained Ohmic contacts and/or to avoid delamination of the silicide and/or metal layers, for instance, most parts or all parts of the carbon or any intermittent layer will be removed to expose the surface of the silicon layer. Especially, the carbon material of the carbon layer may be removed totally or at least most parts of the carbon material of the carbon layer may be removed to reduce the possibility of or substantially avoiding the generation of carbon grains above the surface of the silicon layer during the next acts of the method of manufacturing a metal silicide layer. Lowering the carbon content in this act to a minimum content, such that merely unavoidable residues of carbon material remain in the layer stack above the SiC substrate allows to reduce the risk of delamination actions of metal contacts due to lack of carbon in the metal silicide layers. Hence, higher reliability and better adhesion of the metal contacts which will be provided later may be achieved.

The exposed silicon layer thus prepared is ready for depositing a metal layer above the surface of the silicon layer and thermally treating the stack of at least the silicon layer and the metal layer thereby forming a metal silicide layer. In some examples, one or more metal layers and one or more silicon layers may be comprised in the stack of at least the silicon layer and the metal layer. If more than one layer of the same material is deposited, the layer stack may be alternately stacked. In some embodiments, it may be preferred to deposit an additional silicon layer on the silicon layer exposed in the above-mentioned act in order to thicken the silicon material directly in contact with the polycrystalline SiC layer. The thickness of each of the layers and the total content of silicon and metal of the several silicon and metal layers can be varied depending on the metal silicide to be generated as silicide contact during the thermal treatment of the stack of at least the one silicon layer and the one metal layer.

According to this embodiment, the temperatures for the silicide reaction can be lower (e.g., significantly lower) than in case the silicide reaction is carried out between a metal contained in a metal layer and SiC contained in a SiC substrate. Suitable temperature ranges for the silicide reaction of metal and silicon from the silicon layer are in a range from about 250° Celsius (C) to about 800° C., such as in a range from about 350° C. to about 700° C., for instance about 450° C., for nickel silicide. Other metal silicides may need higher temperature ranges. Those temperatures allow the adjustment of the silicide reaction within the silicon layer instead of consuming the SiC material from the SiC substrate of the polycrystalline SiC layer. Thus, the homogeneity of the metal silicide layer and the SiC structures of the semiconductor devices can be improved. Especially, the differences in layer thicknesses from wafer to wafer can be minimized using the method as described herein. This also increases the reliability of the Ohmic contacts provided on the SiC substrates.

An embodiment described herein relates to a method of manufacturing a metal silicide layer above a SiC substrate by providing a SiC substrate, depositing at least one silicon layer above the SiC substrate, and depositing a metal layer above the silicon layer. The SiC substrate and the stack of layers (comprising the silicon layer and the metal layer) above the SiC substrate may then be heated by laser thermal annealing, thereby forming a metal silicide layer from metal of the metal layer and silicon of the silicon layer. For example, the metal silicide layer may comprise a metal silicide made from metal of the metal layer and silicon of the silicon layer. In some examples, silicon from which the metal silicide of the metal silicide layer is formed is mostly made up of silicon of the silicon layer (e.g., at least half of the silicon that reacts to form the metal silicide of the metal silicide layer is from the silicon layer).

The same substrate as in the embodiments described in the above embodiment of this application may be used as the SiC substrate. The SiC substrate, thus, may comprise or consist of at least one of a SiC wafer or one or more epitaxial layers. Above this SiC substrate, a silicon layer may be deposited. The silicon layer may be deposited in a sufficient thickness to provide enough silicon material for a subsequent silicide process.

In some embodiments of the methods described herein, doping atoms acting as donors may be implanted in a surface region of the SiC substrate by a suitable implantation method. The implanting act may be carried out either directly into the SiC substrate or through the silicon layer provided above the SiC substrate. Thereby the silicon layer may function as energy absorbing layer. Thus, the implantation depths can be adapted in a manner that most of the implanted dopants are close to the surface of the SiC substrate, that means near the interface between the SiC substrate and the silicon layer if this layer is directly provided thereon. Alternatively, the doping atoms may be implanted in a surface region of the silicon layer, or the same or different doping atoms may be implanted in the SiC substrate and the silicon layer. The obtained implants may, for instance, be used as contact implants. The implantation dose and the implantation temperature during the implants may be selected such that an amorphization of the crystalline material as well as a significant movement of the implanted dopants inside the SiC substrate are prevented during the following laser thermal annealing processes for activating the dopants (e.g., using high energies (e.g., energies higher than a threshold energy) and temperatures of at least about 1500° C., for instance about 1700° C.) and for forming a metal silicide layer by silicide reaction (e.g., lower energies and lower temperatures). The activation of the dopants may be carried out with the same laser thermal annealing of a surface region of the SiC substrate during which the polycrystalline SiC layer is generated by splitting the SiC material as described above.

During the laser thermal annealing process applied for triggering the silicide reaction in the above-described embodiments, which is different to the LTA for activating dopants or used for generating the polycrystalline SiC layer in the substrate, the temperature may be selected in a range from about 250° C. to about 800° C., such as in a range from about 350° C. to about 700° C. At the same time, the stack of the at least one metal layer and the at least one silicon layer is heated, and a metal silicide layer as contact layer is generated. In some examples, the laser thermal annealing is carried out with lower energy densities as in the substrate treating act of the first embodiment described herein. Exemplary energy densities are in a range from about 2.0 Joules per square centimeter ($J/cm^2$) to about 3.5 $J/cm^2$, and/or lower than about 3.0 $J/cm^2$, at room temperature (e.g., a range from about 20° C. to about 22° C.), when using laser systems with pulse durations in a range from about 150 nanoseconds (ns) to about 170 ns (e.g., a pulse duration of about 160 ns) and a wavelength in a range from about 300 nanometers (nm) to about 330 nm (e.g., a wavelength of about 308 nm). Therefore, the laser thermal annealing process according to this embodiment results in a substrate structure with at least a monocrystalline SiC substrate layer and a metal silicide layer for contacting the stack with a metal contact, wherein the metal silicide layer is at least in some parts of its surface in direct contact with the SiC substrate layer, thus lowering the electric resistivity of the, thus, provided layered metal contacts.

One or more metal layers may be provided above this layered metal contact as additional contact material which, for instance, may easily be soldered, thus generating an Ohmic contact at the SiC-based semiconductor substrate. The herewith described method results in reliable Ohmic contacts using a metal silicide interlayer while minimizing or avoiding consumption of the SiC substrate during the manufacturing of the metal silicide layer. This method may be used for providing reliable Ohmic contacts with good homogeneity and reproducibility at the rear side and/or the front side of monocrystalline SiC substrates.

Further embodiments relate to semiconductor devices having a structure of at least three layers, comprising a SiC substrate layer, a polycrystalline SiC layer, and a metal silicide layer, wherein the polycrystalline SiC layer is in direct contact with both of the SiC layer and the metal silicide layer. In direct contact means in this context that there are no intervenient layers blocking the electric contact between the SiC substrate and the metal silicide layer in at most parts of the interfaces of the layers. Those semiconductor devices generally have good Ohmic contacts with good homogeneity and reproducibility. Finally, metal contacts may be provided on the metal silicide layer of such a semiconductor device for interconnection of the semiconductor device structures.

Of course, the present disclosure is not limited to the above features and advantages. Indeed, those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated examples can be combined unless they exclude each other. Examples are depicted in the drawings and are detailed in the description which follows.

DETAILED DESCRIPTION

Hereinafter, methods of manufacturing metal silicide layers above silicon carbide (SiC) substrates in SiC based semiconductor devices, which enable the production of contacts, suitably with Ohmic behavior, in an efficient and cost sensitive manner, are described in greater detail. The SiC based substrates generally are SiC work pieces to be processed. For example, the SiC based semiconductor substrate may be a SiC based wafer. The SiC based semiconductor substrate may, alternatively, comprise a base wafer (also called "growth substrate" or "growth wafer") onto which semiconductor layers are deposited, e.g., by using an epitaxial process. At least one epitaxial layer may adjoin a front side of the semiconductor substrate. In some examples, a metal contact layer may be provided on the SiC based semiconductor substrate. In this case, the SiC based semiconductor substrate may be a processed wafer. Exemplary processed wafers with a SiC based substrate may comprise power metal-oxide-semiconductor field effect transistors (MOSFETs) or diodes or junction-gate field effect transistors (J-FETs). Those SiC based electronic components, usually have a n-doped SiC substrate layer at the rear side of the semiconductor substrate to be contacted with a metal contact layer. At the front side of the semiconductor substrate, a p-doped semiconductor layer at the interface between the semiconductor substrate and the metal contact layer may be required for a reliable Ohmic contact. While emphasis is placed on manufacturing methods for Ohmic contacts at power MOSFETs or diode component parts, the embodiments and examples described herein are not intended to be limited to these specific electronic components. Instead, the methods can be used for manufacturing Ohmic contacts of any other electronic components based on a SiC substrate, for example epitaxial layers comprised by the SiC substrate. Moreover, the term "substrate" may include processed wafers comprising several epitaxial layers in which the growth substrate has been at least partially removed before the rear side contact may be generated. In addition, the interface between the semiconductor substrate front and/or rear side and the metal layer may be doped with other dopants. For example, n-doped layers at the front side or p-doped layers at the rear side may also be selected depending on the electronic device produced. For each doping type "n" or "p", different doping concentrations can be used. Generally, these concentrations are identified as n– or p+, for example. In this specification, any doping type indicated herein may have the same or different absolute concentration than the same type in another embodiment or example.

The semiconductor substrate and, if applicable, the epitaxial layers for these electronic devices usually are monocrystalline. Exemplary embodiments of monocrystalline semiconductor materials are mostly based on 4H—SiC or 6H—SiC substrates. Thus, an act (e.g., an initial act) in the herein described methods may be providing a monocrystalline SiC substrate, such as a monocrystalline 4H—SiC or 6H—SiC substrate. As described above, the substrate may comprise device structures within the substrate. Before the act of manufacturing the contact by depositing metal layers, further device structures may be produced within the base substrate. In addition, thickness reducing acts of the semiconductor substrate, if needed, may be applied before the manufacturing of the contacts.

In one embodiment, the laser thermal annealing procedure is carried out at energy densities suitable for generating a polycrystalline layer in the surface regions of the semiconductor substrate, for instance a monocrystalline 4H—SiC or 6H—SiC substrate. The polycrystalline layer may comprise 3C—SiC polytype as the main component of the polycrystalline components generated in the surface region of the substrate during the annealing act. Usually, the decomposition of the monocrystalline substrate into a polycrystalline SiC layer, a silicon layer and a carbon layer may be observed, for example, at room temperature (e.g., a range from about 20° C. to about 22° C.) for a laser system utilizing a pulse duration in a range from about 150 nanoseconds (ns) to about 170 ns (e.g., a pulse duration of about 160 ns) and a wavelength in a range from about 300 nanometers (nm) to about 330 nm (e.g., a wavelength of about 308 nm) at energy densities in a range from about 3.0 Joules per square centimeter ($J/cm^2$) to about 5.0 $J/cm^2$, such as a range from about 3.5 $J/cm^2$ to about 4.0 $J/cm^2$, for instance about 3.8 $J/cm^2$. When changing the wafer temperature, tuning the pulse length to shorter or longer time scales or the laser wavelength to shorter or longer wavelengths the energy densities have to be adjusted accordingly. The thickness and the location of the layers generated by the decomposition reaction within the SiC substrate may be controlled by localized heating of the respective monocrystalline substrate structure. Rearrangement processes may take place, for instance, at the respective surface regions which are to be contacted later with the metal contact layers to be provided. Thereby, the whole surface region or parts of the surface regions suitably selected for providing the contacts may be treated accordingly.

The polycrystalline layer generally provides a smaller band gap than the SiC substrate resulting in good and reliable Ohmic contacts after metallization of contact metals on the polycrystalline layer. In this specification, the term "on" does mean that a layer or element may be directly on or extended directly onto another layer or element or intervening layers or elements may also be present.

In an embodiment, a further silicon layer may be deposited above the first silicon layer before or after the deposition of the metal layer. Two or more additional silicon layers may be deposited before and after the deposition of the metal layer as well. Such additional silicon layers may be used to adjust the thickness of the silicon layer generated by the laser thermal annealing process. For instance, if the thickness of the silicon layer generated during the annealing process is small, the silicide layer to be formed at the interface between the polycrystalline SiC layer and the metal layer is limited in its thickness or silicon from the SiC substrate or the polysilicon carbide layer is consumed for silicide reaction. Adding a further silicon layer allows to increase the thickness of the silicide layer to be formed and, thus, improving the Ohmic contacts provided in the semiconductor device obtained.

In this embodiment, the thickness of the additional silicon layer or the overall thickness of the silicon layers together with the thickness of the metal layer allows the adjustment of the thickness of the obtained silicide layer, but also the adjustment of the silicon to metal ratio in the silicide layer obtained during the annealing process. Depending on the stoichiometric content of silicon to metal provided in the respective layers, the silicon to metal ratio in the obtained metal silicide can suitably be adjusted in view of the metal used and, thus, the electric resistance of the silicide material obtained can be specifically selected according to the needs.

The additional silicon layer may be deposited directly on the surface of the silicon layer which was exposed by removing at least some of the carbon material (e.g., removing most parts of the carbon material), thereby thickening the overall silicon material provided above the SiC substrate. In an alternative embodiment, the additional silicon layer may be deposited on the metal layer, forming a stack of at least a first silicon layer, a metal layer, and a second silicon layer above the SiC substrate. The silicide formation will then proceed from both sides of the metal layer during the annealing act. Similar results are achieved with depositing a silicon layer before and after the formation of a metal layer. Thereby the silicon to metal ratio can individually be adjusted within suitable ranges. For instance, if the metal or metal compound is Ni or NiSi, then the stoichiometric content of the $Ni_xSi_y$ (resulting after the final laser irradiation) of nickel to silicon may be within the range x/y of 0.5 to 2.0. Good Ohmic contacts will be achieved with x/y being at about 2.0 as the main component of the nickel silicide layer. For other metals or metal compounds, like titanium (Ti), TiC, TiNi, cobalt (Co), palladium (Pd), tungsten (W), or NbNi, the stoichiometric content may between about 0.5 to 2.0. Exemplified metal silicide materials for good Ohmic contact layers are $Ni_2Si$, NiSi, TiSi, $CoSi_2$, and $W_5Si_3$.

In an embodiment, the method as described herein comprises an implantation of doping atoms in a surface region of at least one of the SiC substrate, the SiC polycrystalline layer, the silicon layer formed by the laser thermal annealing process, and the further silicon layer additionally deposited on the silicon layer. An activation of the dopants by a laser thermal annealing process with high temperatures (e.g., temperatures higher than a threshold temperature) and high energies (e.g., energies higher than a threshold energy) may be carried out before metal silicide formation acts. This implantation and activation, if needed, generally is carried out before the deposition of a metal layer. The implantation may result in implanted doping regions within the surface region of the semiconductor substrate or polycrystalline layer. These doping regions may, thus be contacted by the contact layers provided thereon starting with the self-aligned silicide layer described herein. This embodiment may be used to provide rear side contacts with metal silicide contact layers having a sufficient homogeneity and methods for producing them with good reproducibility of the electric resistivity between the metal layers and the doped regions in the SiC regions of the semiconductor devices. The obtained contacts can be obtained with Ohmic behavior in an efficient and cost sensitive manner.

In a further embodiment, the methods described herein encompass a thermal treating act in which the stack of at least the silicon layer and the metal layer are heated or heat treated. The thermal treating may comprise a rapid thermal processing of the SiC substrate and the stack of layers above the SiC substrate. Rapid thermal treating means in the context of this application a process used in semiconductor device fabrication which involves heating a single wafer or a semiconductor substrate at a time in order to affect its electric properties. The electric properties which may be affected in this embodiment are caused by the silicide reaction between the silicon and the metal layers to generate the silicide layer, and diffusion processes of doping atoms from the silicon layers into the SiC structures of the SiC substrate or the polycrystalline SiC layer. Those diffusion processes usually are very slow (e.g., slower than a threshold process speed) in SiC and with a low depth of diffusion into the SiC material (e.g., a depth of diffusion lower than a threshold depth), but still are sufficient to improve the Ohmic contacts, that means lower the electric resistivity of the respective layer materials. Suitable temperatures for this rapid thermal processing are in a range from about 350° C. to about 700° C., such as a range from about 400° C. to about 650° C., for instance about 450° C. For example, in NiSi systems, the rapid thermal processing may comprise heating the SiC substrate (and the stack of layers above the SiC substrate, for example) at a temperature for a duration of time (e.g., about two minutes in NiSi systems), wherein the temperature is in a range from about 350° C. to about 700° C., such as a range from about 400 to about 650° C., for instance about 450° C. In other metal silicide systems (e.g., metal silicide systems other than NiSi systems), the temperature and/or the duration of time may be adjusted differently within a suitable range.

In a further embodiment of the method as described before, the rapid thermal processing comprises a laser thermal annealing of the SiC substrate, the polycrystalline SiC layer, and the metal silicide layer. By laser thermal annealing, the laser radiation may selectively be localized in the material at the intended regions to be heated. Thereby the heating of the material within the intended regions can be increased rapidly while the temperature of the surroundings, such as the layers next to the intended regions, is not raised so fast or is significantly kept below the temperature ranges generated in the intended regions. This can be used to avoid thermal damages in the surrounding portions of a semiconductor device manufactured, for example, at the front side of the semiconductor device with the epitaxial structures while generating the rear side contacts or vice versa.

According to some of the above embodiments, the metal silicide of the metal silicide layer may comprise the metal of the metal layer and the silicon contained in the silicon layer. Thus, the silicon from the SiC substrate preferentially is not involved or involved as little as possible in the formation of the metal silicide layer. Hence, the SiC material usually is not reduced and reliable contacts with high homogeneity can be generated.

In any or at least some embodiments of the above-described methods, the metal silicide of metal silicide layer is formed from metal contained in the metal layer and from silicon contained in the silicon layer, in the SiC substrate, or the SiC polycrystalline layer. Most parts of the silicon are from the silicon layer, while the parts of silicon contained in the SiC substrate or SiC polycrystalline layer is as low as possible. As less parts are from the SiC material, the thickness of the respective semiconductor SiC material is substantially maintained. Therefore, it is advantageous to adjust the thickness of the silicon layer such that most of the silicon for the silicide reaction is used from the silicon layer. Therefore, the silicon layer provided in the method as described herein may be called sacrificial layer and is used to increase the reliability of the electric connectivity of the semiconductor devices. This may improve the manufacturing of a constant thickness of silicide layer and SiC substrate and SiC layers and, thus, electric connectivity of the semiconductor devices manufactured by this method compared to silicide reactions directly in SiC material as in the common manufacturing methods of such contacts.

In an alternative embodiment to the foregoing, the metal silicide of metal silicide layer is formed from metal contained in the metal layer and at least partially from the silicon contained in at least one of the silicon layers or the further silicon layer provided in a stack above the SiC substrate. Even if some parts of the silicon may come from the polycrystalline SiC layer or the SiC substrate, most of the silicon preferentially may come from the silicon layers to limit the thinning of the SiC material. The selectivity of silicide formation can be adjusted by the temperature applied during the silicide reaction, because silicide reactions of SiC material usually needs higher temperature compared to silicide reactions of Si material. Nevertheless, some minor silicide reactions from silicon contained in SiC material would fall within the scope of the described methods. However, the use of silicon layers generated within the surface region of the SiC substrates or additionally deposited silicon layers are one of the main principles described herein which allow maintaining the SiC substrate and SiC layer thickness as constant as possible during the contact with metal silicide layers.

In some embodiments, the silicon layer is generated by depositing at least one silicon layer above the SiC substrate and depositing a metal layer above the silicon layer. Thereafter, a laser thermal annealing of the SiC substrate and the stack of layers above the monocrystalline SiC substrate is carried out in order to form a metal silicide layer in direct contact to the monocrystalline SiC substrate. The metal silicide of the metal silicide layer may be formed from metal contained in the metal layer and silicon contained in the silicon layer. In some examples, silicon from which the metal silicide of the metal silicide layer is formed is mostly made up of silicon of the silicon layer (e.g., at least half of the silicon that reacts to form the metal silicide of the metal silicide layer is from the silicon layer). As described in the previous embodiments, some parts of the monocrystalline SiC substrate may take part in the silicide reaction, too. The silicide formation from SiC material generally is possible, but the silicon layer is more likely for silicide reaction and, thus, a small content of the formed silicide comes from the SiC material only. Hence, also the method of this embodiment allows to use the silicon from the silicon layer deposited above the SiC substrate as a kind of sacrificial layer instead of reducing the thickness of the SiC substrate for the silicide reaction. This increases the reliability and homogeneity of the manufactured contacts based on a metal silicide layer.

According to this embodiment, the thermal annealing may be carried out using a laser system configured with laser system parameters comprising a pulse duration in a range from about 150 ns to about 170 ns, a wavelength in a range from about 300 nm to about 330 nm, and/or a maximum pulse density of about 3.0 J/cm$^2$ at room temperature (e.g., a range from about 20° C. to about 22° C.). For example, the laser system may be adjusted to the laser system parameters. Thus, the energy density used is low enough to avoid or at least lower the risk of any damages of epitaxial structures or semiconductor parts of the semiconductor device outside the laser thermal annealing region. The energy densities are also selected such that the maximum is lower than needed for a silicide reaction between metal and the silicon of the SiC substrate, thereby achieving the above-described effects.

In at least one example, the method as described herein comprises the specific adaptation of the concentration profile in the surface region of the SiC substrate or the polycrystalline SiC layer. Generally, the concentration profile applied by a plasma deposition has a concentration maximum close to the interface of the SiC substrate to the metal silicide layer, while the concentration continuously decreases with vertical expansion into the substrate layer. In some examples, the concentration profile can suitably be selected by using different conditions in the implantation act or implantation acts for doping atoms, if more than one implantation act is used for generating the doping regions. Suitable conditions to be adjusted may be the ionizing rate, the implantation energies of the plasma, the implantation doses of the individual plasma depositions and so forth. In addition or alternatively, the chemical composition of the substances to be deposited may be suitably adapted. For example, nitrogen or phosphor are suitable doping atoms for being used in the methods as described herein. Furthermore, ion implantation acts with implantation energies adapted to the thickness of the silicon layer may be applied because the silicon layer can act as an energy absorber so that also such an implantation act can result in a high doping concentration (e.g., a doping concentration higher than a threshold doping concentration) at the interface between 3C—SiC and metal or metal silicide.

A specifically adjusted concentration profile, suitably with a high concentration of dopants in a region adjoining the interface from the substrate or polycrystalline layer to the metal silicide layer, leads to a bandgap narrowing. Thereby, the generation of a metal or metal silicide contact with low contact resistance on the thus prepared semiconductor substrates can be facilitated and results in low-cost manufacturing alternatives of Ohmic contacts on SiC based semiconductor devices.

Some of the above-described embodiments may further comprise additional beamline implantation acts carried out with one or more tilted ion beams. Those additional ion beam implants of dopants may be suitably applied to decrease the vertical extent of the dopant concentration profile within the surface region of the SiC substrate or the polycrystalline SiC layer. For example, if the implantation energy cannot further be lowered, it is possible to reduce the depth of implantation when using tilted ion beams. Thereby, doping regions very close to the interface of the semiconductor substrate and the metal silicide layer to be generated may be obtained, thus improving the reproducibility and homogeneity of the contacts between the implanted regions and the later produced metal contacts. Any tilt angle used in common implantation technics for semiconductor devices can be used in the beamline implants.

In some embodiments, the method further comprises implanting of doping atoms in a surface region of the SiC substrate and activating the doping atoms by laser thermal annealing of a surface region of the SiC substrate. In this embodiment, a polycrystalline SiC layer may be formed during the laser thermal annealing of the SiC substrate with high energies (e.g., energies higher than a threshold energy), wherein the thus formed polycrystalline SiC layer comprises 3C—SiC polytype. For example, the polycrystalline SiC layer may comprise 3C—SiC polytype as the main component of a crystal structure of the polycrystalline SiC layer. The 3C—SiC polytype further reduces the electric resistivity due to the low band gap in the SiC materials compared to the monocrystalline SiC substrates such as, e.g., 4H—SiC or 6H—SiC substrates. This activation may be carried out before the deposition of the metal layer and the following silicide reaction for generating the metal silicide layer described above.

In some of these embodiments of the method as described herein, the metal silicide layer may be formed from metal contained in the metal layer and silicon contained in at least one of the silicon layers or the SiC substrate or the polycrystalline SiC layer. Thus, using a laser thermal annealing process, a polycrystalline SiC surface region may be formed within the SiC substrate and a metal silicide layer as contact layer may be formed in one heating act (e.g., the polycrystalline SiC surface region and the metal silicide layer may be formed at the same time). This again results in a semiconductor device having a structure of at least three layers comprising a SiC substrate, a polycrystalline SiC layer, and a metal silicide layer, wherein the polycrystalline SiC layer is arranged in direct contact with both of the SiC substrate as well as with the metal silicide layer at least at parts of the interfaces between the three layers. The semiconductor device is provided with good Ohmic contacts with improved homogeneity of the respective thicknesses of the layer stacks manufactured above the SiC substrate (with epitaxial layers provided within the surface region of the semiconductor SiC substrate, for example). In addition, the homogeneity of the provided layered stack increases the reliability of the metal contacts of the semiconductor devices manufactured.

Therefore, the application further describes an embodiment of a semiconductor device having such a structure as explained before. In some embodiments, the polycrystalline SiC layer comprises 3C—SiC polytype (as the main component, for example) in order to lower the electric resistivity compared to the monocrystalline SiC substrate materials, such as 4H—SiC or 6H—SiC polytype materials for the substrate.

In some embodiments, the semiconductor device may be provided with epitaxial layers (e.g., n-type SiC epitaxial layers) comprising epitaxial structures. For example, the epitaxial structures may be provided within or on surface regions of the epitaxial layers (e.g., the n-type SiC epitaxial layers). The epitaxial structures may be provided for the front side or rear side structuring of the semiconductor devices. Such structures can be differently arranged and manufactured within the general knowledge of a skilled in the art.

In an embodiment, the semiconductor device may comprise a stack of layers, including the metal silicide layer, above the crystalline SiC substrate and the polycrystalline SiC. A carbon content of the stack of layers may be less than about 20 atomic-%, such as less than about 15 atomic-%, such as less than about 10 atomic-%. A low content of carbon in this layer stack improves the reliability because less carbon content means that less regions with carbon grains are contained within the layer stack, especially at the interfaces between the polycrystalline SiC layer and the metal silicide layer or at the interface between the metal silicide layer and the metal layer. Such carbon grains at the interfaces or surfaces of contact layers increase the possibility of generating delamination effects of the metal contacts provided at the SiC semiconductor substrates. Hence, less contents of carbons may lower this risk. Therefore, the methods for manufacturing metal contacts as described herein are intended to lower or limit the carbon content within the layer stack so that metal contacts with high reproducibility and good reliability can be manufactured. In some of these exemplified methods described herein, the carbon content is minimized by removing the carbon layer intermediately generated by thermal annealing. In alternative embodiments, the first thermal annealing act is avoided and a silicon layer for the silicide generating procedure is deposited and a laser thermal annealing is carried out at the end of the manufacturing procedure only. Thus, formation of carbon grains at the interfaces within the layer stack can be minimized as well.

Figure 1:
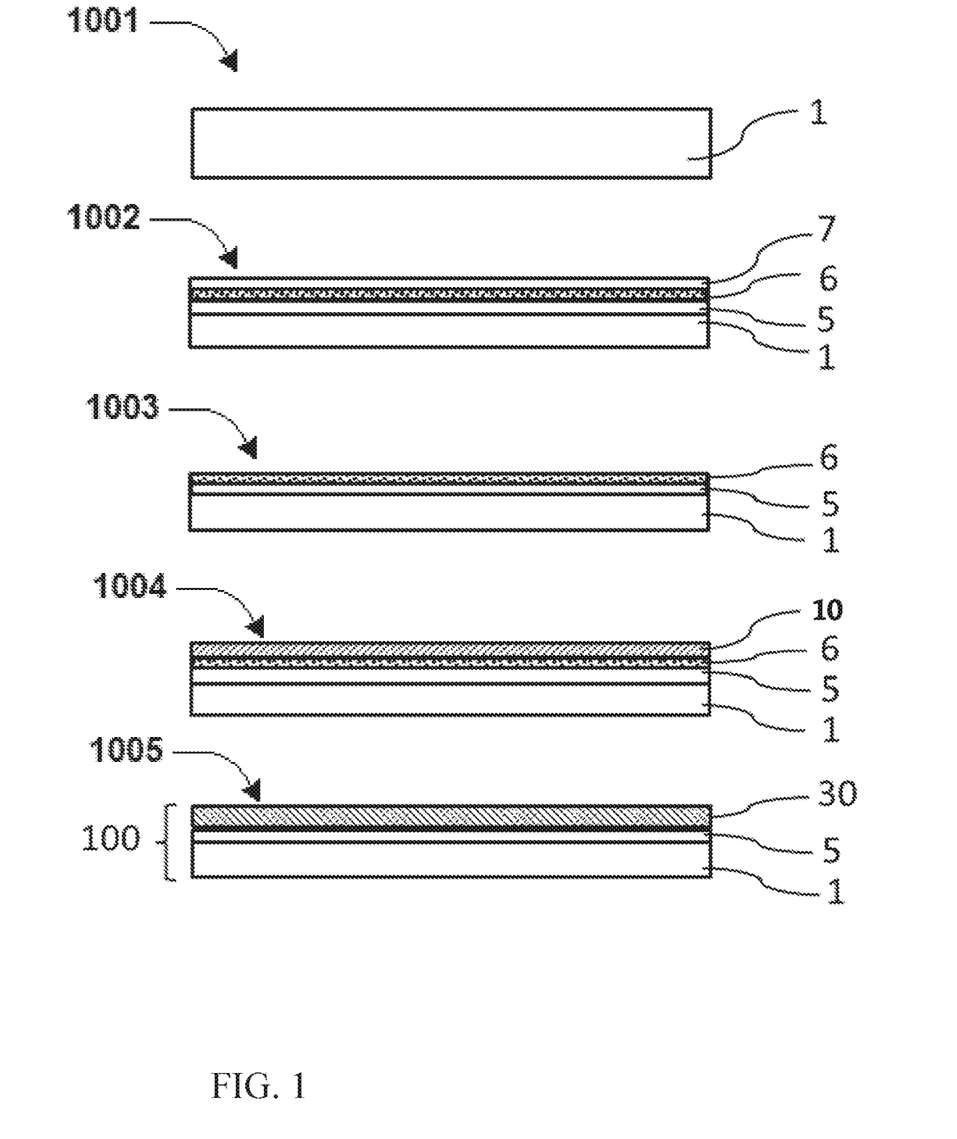
FIG. 1 illustrates an exemplary embodiment of a method of manufacturing a metal silicide layer above a silicon carbide (SiC) substrate comprising a silicon layer formation act by laser thermal annealing.

The above-described embodiments will be further described by referring to the drawings which show specific examples of the methods and semiconductor devices obtained therewith. Referring now to FIG. 1, an exemplary embodiment of a method of manufacturing a metal silicide layer above a SiC substrate is shown in several acts starting with providing a monocrystalline SiC substrate 1 and ending with a semiconductor device 100 comprising a SiC substrate layer 1, a polycrystalline SiC layer 5, and a metal silicide layer 30. FIG. 1 illustrates a cross-section of a monocrystalline SiC substrate layer 1 made, for example, mainly from a 4H—SiC or 6H—SiC material, wherein the substrate may be a wafer or processed wafer with epitaxial layers or device structures. At act 1001, the SiC substrate may be provided. At act 1002, the SiC substrate is heated at one of its surface regions, for instance, at the frontside (Si face) of a substrate wafer without epitaxial layer, by a laser thermal annealing (LTA) process. Suitable LTA conditions are, for instance, an energy of about 3.8 J/cm$^2$. During the LTA processing, the SiC material undergoes a phase separation into a polycrystalline SiC layer 5, an amorphous silicon (Si) layer 6, and an amorphous carbon (C) layer 7. The obtained thickness of the polycrystalline SiC layer 5 may be in a range from about 15 nm to about 25 nm. The obtained thickness of the Si layer 6 may be in a range from about 5 nm to about 10 nm. The obtained thickness of the C layer 7 may be in a range from about 5 nm to about 10 nm. As there are no device structures within the substrate surface shown in this exemplified embodiment, the phase separated layers are arranged above the whole surface of the substrate layer 1. In other embodiments (not shown in this example), the respective phase separation of the SiC may selectively be carried out at those regions of the substrate surface without device structures thereon.

At act 1003 of FIG. 1 (which may be after acts 1001 and 1002, for example), the C layer 7 is removed by ion gun etching. Other etching methods suitable for semiconductor processing, such as applying an oxygen plasma treatment, can be used as well. At least some of the carbon material in the C layer 7 is removed (e.g., most parts of the carbon material in the C layer 7 may be removed and/or all of the carbon material in the C layer 7 may be removed) such that only insignificant amounts of carbon may remain in depressions or pores of the Si layer 6. In some embodiments, all or most of the carbon material is removed. If the thickness of the Si layer 6 is high enough for the subsequent acts, it is favorable to also remove some parts of the surface area of the Si layer 6 to lower the remaining carbon content as much as possible. After removal of the C layer 7, the surface of the Si layer 6 is exposed.

At act 1004, a metal layer 10 is deposited, on the exposed Si layer 6, to form a stack of at least the silicon layer 6 and the metal layer 10. Suitable deposition methods are sputtering of one or more metals on the exposed Si layer 6, thereby forming a metal layer containing one or more metal components. Alternatively, it is also possible to deposit the metal layer by other methods such as vapor deposition or atomic layer deposition (ALD). ALD is a thin-film deposition technique based on sequential use of a gas phase chemical deposition process. In this embodiment, a NiAl alloy is deposited by a sputtering method. The NiAl alloy may have an Al content of at most about 25 atomic-%, such as an Al content of at most about 15 atomic-%, such as an Al content in a range from about 1 atomic-% to about 5 atomic-%. The thickness of the NiAl layer may be in a range from about 30 nm to about 50 nm (e.g., the thickness of the NiAl layer may be about 40 nm).

After the provision of a stack of layers above the polycrystalline SiC layer 5, namely at least one Si layer 6 with a thickness in a range from about 7 nm to about 10 nm and at least one metal layer 10 with a thickness in a range from about 35 nm to about 45 nm (e.g., the at least one Si layer 6 and the at least one metal layer 10 may be free of carbon contents), at act 1005, the stack of layers (e.g., the stack of layers comprising Si layer 6 and metal layer 10) is thermally treated at temperatures of at most 800° C., such as temperatures of at most 600° C., such as temperatures in a range from about 400° C. to about 500° C. (e.g., the stack of layers may be treated at a temperature of about 450° C.), thereby forming a metal silicide layer 30. The heating times are in a range from about 1 minute to about 100 minutes, such as a range from about 1 minute to about 10 minutes. For instance, a heating time of 2 minutes at a thermal treatment temperature of 450° C. may be sufficient for alloying reactions within the NiAl metal layer 10 and the Si layer 5, but without significant reactions with the silicon from the crystalline or polycrystalline SiC materials in layers 1 or 5. Higher temperatures or longer thermal treating times may cause at least some alloying reactions of Ni with silicon of the SiC material so that carbon contents in the alloyed metal silicide layer may occur. This could lead to carbon grains which are not preferred due to delaminating effects in the finished semiconductor devices, especially in high temperature conditions (e.g., temperatures higher than a threshold temperature).

In order to avoid these alloying reactions with consumption of SiC material, the temperatures and the heating times can be properly adjusted, but also the thickness of the silicon and metal layers can be increased to reduce these effects. For example, additional silicon or metal layers may be deposited as explained in other embodiments described herein.

In the manufactured semiconductor device 100 comprising at least a SiC substrate layer 1, a polycrystalline SiC layer 5, and a metal silicide contact layer 30, the content of carbon can be minimized Due to the adjustment of the thickness of the silicon and metal layer, the stoichiometric proportion of silicon and metal, here for example Ni, can be properly adjusted. For instance, $Ni_2Si$ may be obtained by a rapid thermal processing with a temperature of at least about 400° C. Other $Ni_xSi_y$ contents may be achieved at lower temperatures of at least about 300° C. According to the method as described herein, the carbon content in the metal silicide layer 30 may be lower than about 20 atomic-%, such as lower than about 15 atomic-%, such as lower than about 10 atomic-%.

In some embodiments, the obtained semiconductor device with the polycrystalline SiC layer 5 in direct contact with the SiC substrate 1 and the metal silicide layer 30 may be treated by a further rear side laser thermal annealing process at higher temperatures (e.g., temperatures in a range from about 950° C. to about 1050° C.) for improving the Ohmic contact of the metal silicide layer 30 and the SiC substrate 1. Generally, however, the polycrystalline SiC layer as well as the metal silicide (e.g., $Ni_2Si$) provide a low electric resistivity without such an additional thermal anneal. Nitrogen or phosphorus as dopant in the surface region of the SiC layer or in the metal silicide layer improve the metal contacts provided by the method as described herein in some extent as well.

The method according to this embodiment can further be used for manufacturing the rear side contacts of a SiC wafer. The energy used in the LTA can be adjusted within a lower energy density, which allows a more stable manufacturing process without affecting the device structures at the front side of the device in large extent. It is also possible to find a temperature range for the rapid thermal treating, if used, which is in a temperature range suitable for the device structures at the front side of the SiC wafer processed. Hence, the herein described methods have several advantages and are suitable for manufacturing metal contacts above a SiC substrate with high reliability and homogeneity as it reduces or avoids carbon-grain precipitation within the metal silicide layer. Thus, delamination problems (that may occur in some devices and/or systems) can be minimized or avoided.

Figure 2:
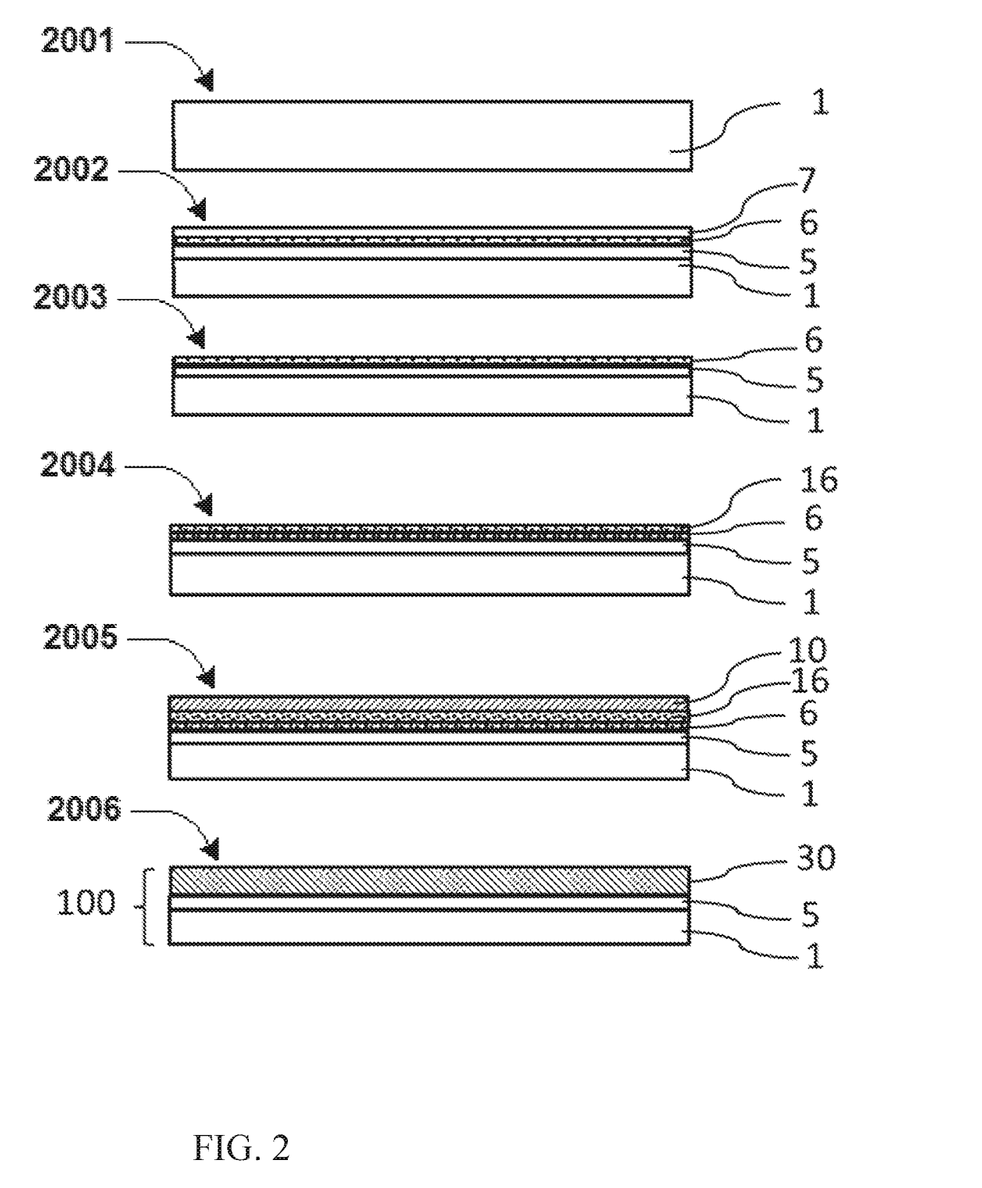
FIG. 2 illustrates an exemplary embodiment of a method of manufacturing a metal silicide layer above a SiC substrate comprising silicon layer formation acts by laser thermal annealing and by silicon deposition.

Referring now to FIG. 2, an exemplary embodiment of a method of manufacturing a metal silicide layer above a SiC substrate is shown. Acts 2001, 2002 and 2003 of FIG. 2 may be the same as acts 1001, 1002 and 1003 of FIG. 1, respectively (e.g., acts 2001, 2002 and 2003 may comprise providing a SiC substrate wafer, LTA of the surface region and phase separation of the SiC in the surface region such that a polycrystalline SiC layer 5, a Si layer 6, and a C layer 7 are stacked above the SiC substrate 1, and/or removal of the C layer 7).

After having removed the C layer 7 or at least some of the carbon material of this layer (in act 2003, for example), the surface of the silicon layer 6 is exposed. In this embodiment, at act 2004, a further amorphous or crystalline silicon layer 16 is deposited in a thickness sufficient to deliver enough silicon material for the silicide reaction. Acts 2005 and 2006 of FIG. 2 (e.g., depositing a metal layer 10 and thermal treating the stack of layers 6, 16, 10 above the polysilicon SiC layer 5) may correspond to (e.g., may be identical to) acts 1004 and 1005 of FIG. 1, respectively. The additional silicon layer 16 may be used to adjust the thickness of the silicon layer 6 obtained by the phase separation of the SiC material during LTA. Especially, in case the amount of silicon in the silicon layer, thus obtained, is not sufficient to react with all of the metal component of the metal layer 10 during the silicide reaction, that means silicon is present in under-stoichiometric conditions in the layer stack, additional silicon material may be provided by the additional silicon layer 16. A thickness high enough to avoid at least any significant alloying reaction of silicon from the polysilicon SiC layer 5 or the SiC substrate 1 shall be implemented in the method as described herein to avoid significant consumption of the SiC material and phase separation of the SiC material. The silicon layers 6 and 16 are, thus, used as sacrificial layers for the alloying reaction.

Hence, the method allows the manufacturing of metal contacts based on metal silicide contact layers with high homogeneity of the generated semiconductor devices 100. At the same time, Ohmic contacts with high reliability are produced with this new method as described herein.

Figure 3:
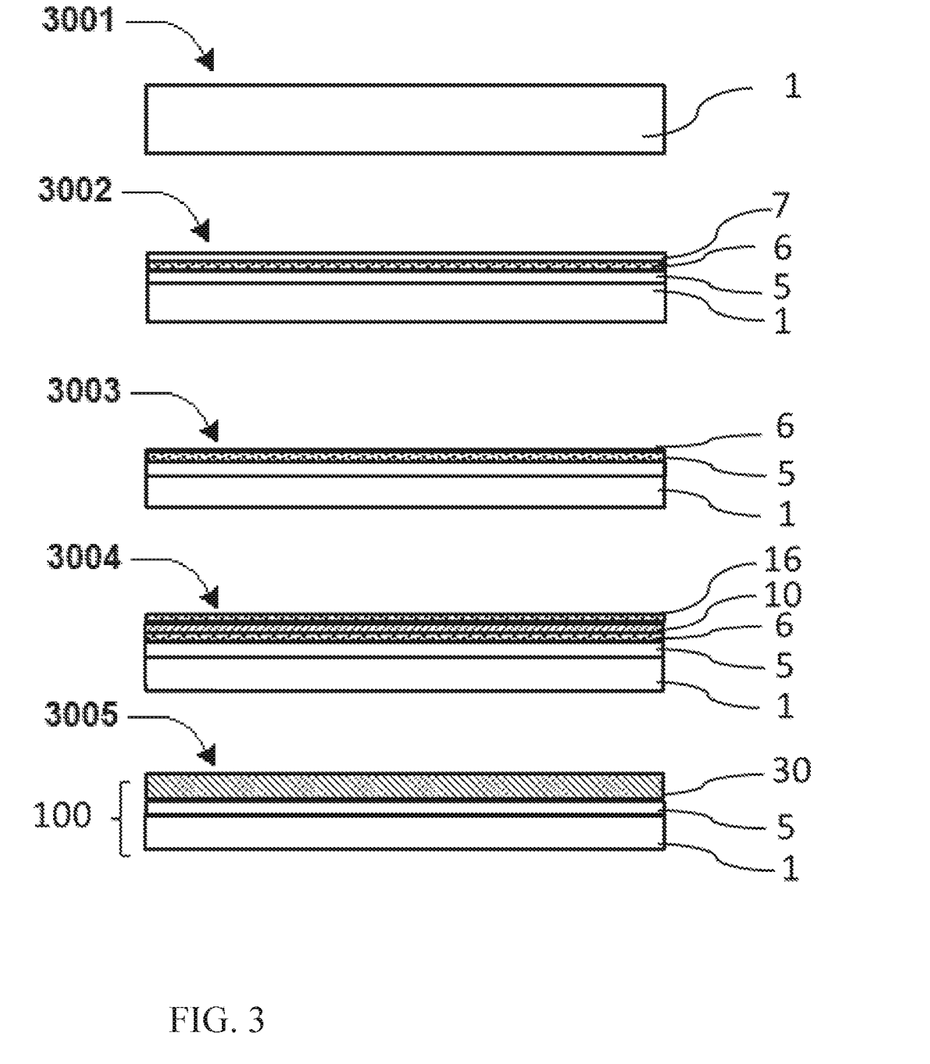
FIG. 3 illustrates a further exemplary embodiment of a method of manufacturing a metal silicide layer above a SiC substrate comprising silicon layer formation acts by laser thermal annealing and by silicon deposition.

Now referring to FIG. 3, an alternative exemplary embodiment of the method as described in FIG. 2 is shown. Any of the acts described are identical to the acts as described in FIG. 2 except that the additional silicon layer 16 is deposited above the SiC substrate 1 after the deposition of the metal layer 10. Acts 3001, 3002 and 3003 of FIG. 2 may be the same as acts 2001, 2002 and 2003 of FIG. 2, respectively. At act 3004, the metal layer 10 may be deposited, on the exposed Si layer 6, and the additional silicon layer 16 may deposited be deposited on the metal layer 10. A stack of layers 6, 10, 16 comprising a metal layer (e.g., metal layer 10) interposed between two silicon layers (e.g., silicon layer 6 and the additional silicon layer 16) is then thermally heated at act 3005, for example, by using a rapid thermal anneal (RTA) to alloy the silicon and the metal components contained in the respective layers to a metal silicide layer 30. Of course, more than three layers can be used to form such a stack of silicon and metal layers, of instance, two or more metal layers and two or more silicon layers may be deposited above the SiC substrate 1. If two or more metal layers are used, the same or different metal components may be deposited by sputtering or vapor deposition techniques.

The, thus, obtained semiconductor device 100 is similar as those obtained from the methods described in FIGS. 1 and 2. The difference from this exemplified embodiment to the others may be the good adjustment of the contents of the alloying components for metal silicide layer 30.

Figure 4:
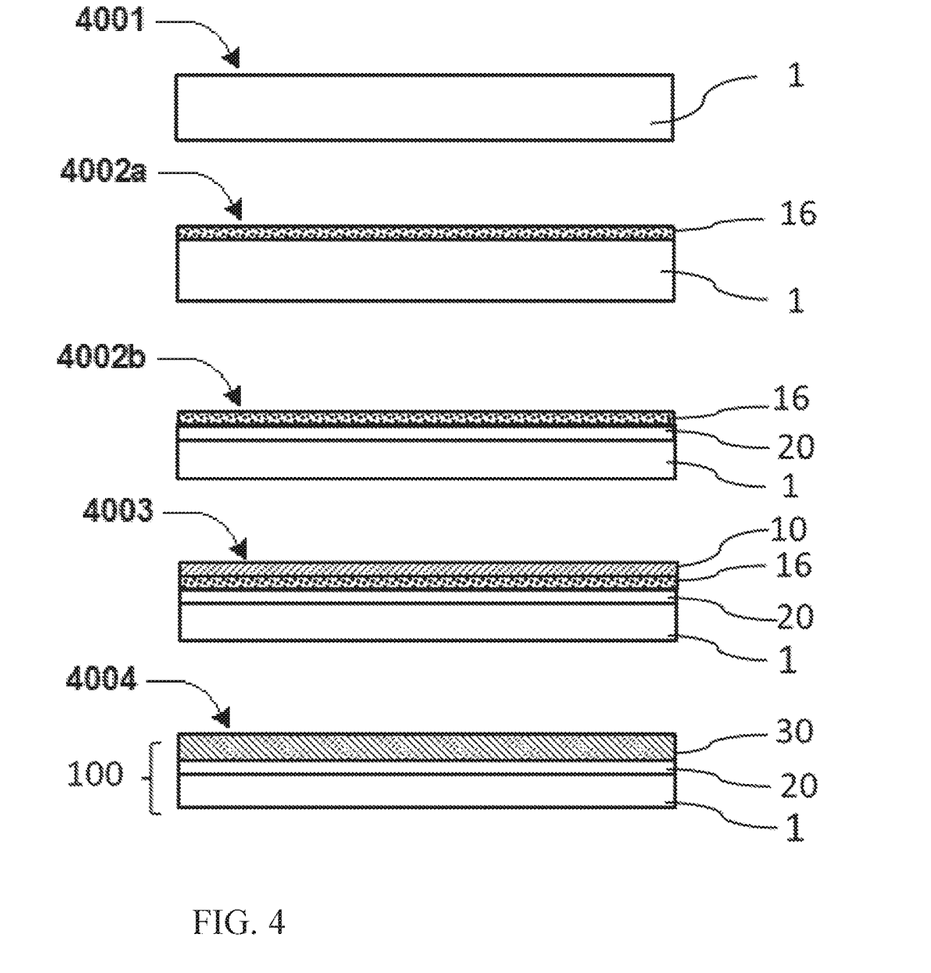
FIG. 4 illustrates a further exemplary embodiment of manufacturing a metal silicide layer above a SiC substrate comprising a silicon layer formation act by silicon deposition.

Referring now to FIG. 4, an exemplified embodiment of a further method of manufacturing a metal silicide layer 30 above a SiC substrate 1 is shown. The SiC substrate 1 is a silicon wafer substrate with or without epitaxial layers or device structures at its surface. In the FIG. 4, an n-type wafer substrate without such structures is shown. At act 4001, the SiC substrate 1 is provided. At act 4002a/4002b, a silicon layer 16 is deposited above the SiC substrate 1, either directly or via intermediate layers. Further silicon layers may be used to thicken the silicon layer 16, if necessary. Act 4002a in FIG. 4 shows an example in which the silicon layer 16 is above the SiC substrate 1 (e.g., the silicon layer 16 may be in direct contact with the SiC substrate 1). Act 4002b in FIG. 4 shows an example in which the silicon layer 16 above an exemplary layer 20 with implanted dopants (e.g., the silicon layer 16 may be in direct contact with the exemplary layer 20).

At act 4003, a metal layer 10 can be provided above the silicon layer 16 or a stack of silicon layer 16 and the exemplary layer 20 with implanted dopants. At act 4004 (after act 4003, for example), a metal silicide layer 30 may be generated by thermal annealing of at least the silicon layer 16 and the above deposited metal layer 10. In some embodiments, low temperatures (e.g., temperatures lower than a threshold temperature) are used to avoid damages of the front side structures of the semiconductor device 100 to be manufactured.

In some examples, an implantation of doping atoms using an ion implantation technique may be carried out. Thereby doping atoms may be implanted through the silicon layer 16 into the surface region of the SiC substrate 1 forming a layer 20 with implanted dopants. The silicon layer 16 can be used as an energy absorption layer to provide flat doping profiles. Flat doping profiles are advantageous for achieving improved Ohmic contacts as they are near to the interface between the SiC substrate 1 and the metal silicide layer 30 generated at the end of the manufacturing method. In this case, an additional activation of the doping atoms is sometimes not necessary.

The implanted doping atoms, e.g., nitrogen or phosphorus, can be used to improve the contact properties of the metal silicide layer 30. The implantation can be carried out directly into the silicon layer 16 or in the interface region of the SiC substrate 1 and the silicon layer 16 or even in both layers, thus forming layer 20 with implanted dopants.

In an alternative embodiment, not shown in the Figures, a plasma implantation can be carried out into the surface region of the SiC substrate 1 before the silicon layer 16 will be deposited. Combinations of the above-described implantation acts can be used to generate specific doping regions within the interface regions of the substrate 1 and the metal silicide layers 30. All these implants are close or within the interface between the SiC substrate 1 and the metal silicide layer 30 in the semiconductor devices manufacture according to the methods as described herein. A further advantage is that the further process acts of the metal contacts do not affect the doping regions or dopant amounts and, thus, Ohmic contacts with high reliability and homogeneity can be produced by the methods as disclosed herein.

Figure 5:
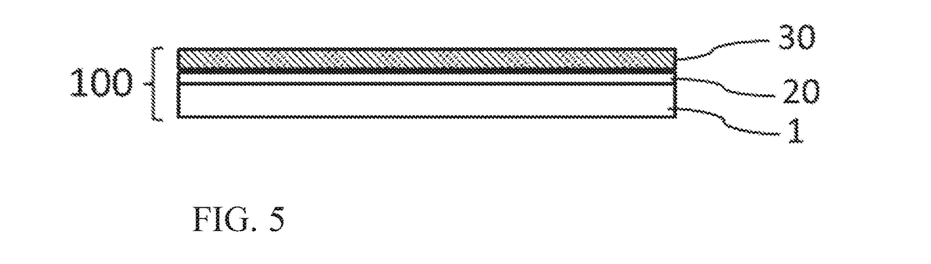
FIG. 5 illustrates an exemplary embodiment of a SiC based semiconductor device obtainable by one of the exemplary embodiments described in FIGS. 1 to 3.

Referring now to FIG. 5, an exemplified embodiment of a semiconductor device 100 obtainable by a method as described herein is shown. The semiconductor device has a structure of at least three layers, namely a SiC substrate layer 1, a polycrystalline SiC layer 5, and a metal silicide layer 30. According to this example, the polycrystalline SiC layer 5 is in direct contact with the SiC substrate 1 at one surface of the layer and with the metal silicide layer 30 at the other surface of the layer, thereby electrically connecting the SiC substrate 1 and the metal silicide contact layer 30. Thus, band gap narrowing due to the specific properties of polycrystalline polymorph can be used to provide reliable Ohmic contacts in semiconductor device 100. Further layers above the metal silicide layer 30 may be provided as well as device structures within the SiC substrate.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments and examples shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A method of manufacturing a metal silicide layer above a silicon carbide (SiC) substrate, the method comprising:
    providing a SiC substrate;
    performing laser thermal annealing of a surface region of the SiC substrate, wherein the performing the laser thermal annealing splits SiC material, in the surface region of the SiC substrate, into:
        a polycrystalline SiC layer;
        a silicon layer above the polycrystalline SiC layer; and
        a carbon layer above the silicon layer;
    removing at least some carbon material of the carbon layer to expose a surface of the silicon layer;
    depositing a metal layer above the silicon layer to form a stack of layers comprising the silicon layer and the metal layer; and
    thermally treating the stack of layers to form a metal silicide layer.

2. The method according to claim 1, wherein the SiC substrate is a 4H—SiC semiconductor substrate or a 6H—SiC semiconductor substrate.

3. The method according to claim 1, wherein the polycrystalline SiC layer comprises 3C—SiC polytype.

4. The method according to claim 1, comprising:
at least one of before or after the depositing the metal layer, depositing a further silicon layer above the silicon layer.

5. The method according to claim 1, comprising:
before the depositing the metal layer, implanting doping atoms in a surface region of at least one of the SiC substrate, the polycrystalline SiC layer, or the silicon layer.

6. The method according to claim 4, comprising:
before the depositing the metal layer, implanting doping atoms in a surface region of at least one of the SiC substrate, the polycrystalline SiC layer, the silicon layer, or the further silicon layer.

7. The method according to claim 1, wherein the thermally treating the stack of layers comprises thermally treating the SiC substrate and the stack of layers by rapid thermal processing.

8. The method according to claim 1, wherein metal silicide of the metal silicide layer comprises metal of the metal layer and silicon of the silicon layer.

9. The method according to claim 1, wherein metal silicide of the metal silicide layer is formed from metal of the metal layer and silicon of at least one of the silicon layer or the SiC substrate layer.

10. The method according to claim 4, wherein metal silicide of the metal silicide layer is formed from metal of the metal layer and silicon of at least one of the silicon layer or the further silicon layer.

11. A semiconductor device, comprising:
a silicon carbide (SiC) substrate;
a metal silicide layer; and
a polycrystalline SiC layer in direct contact with both of the SiC substrate and the metal silicide layer.

12. The semiconductor device according to claim 11, wherein the polycrystalline SiC layer comprises 3C—SiC polytype.

13. The semiconductor device according to claim 11, wherein a main component of a crystal structure of the polycrystalline SiC layer is 3C—SiC polytype.

14. The semiconductor device according to claim 11, wherein the SiC substrate comprises n-type SiC epitaxial layers comprising epitaxial structures.

15. The semiconductor device according to claim 11, comprising:
a stack of layers, comprising the metal silicide layer, above the SiC substrate and the polycrystalline SiC layer, wherein a carbon content of the stack of layers is less than about 20 atomic-%.

16. A method of manufacturing a metal silicide layer above a silicon carbide (SiC) substrate, the method comprising:
providing a SiC substrate;
performing laser thermal annealing of a surface region of the SiC substrate, wherein the performing the laser thermal annealing splits SiC material, in the surface region of the SiC substrate, into:
a polycrystalline SiC layer;
a silicon layer above the polycrystalline SiC layer; and
a carbon layer above the silicon layer;
removing at least some carbon material of the carbon layer to expose a surface of the silicon layer;
depositing a further silicon layer above the silicon layer;
depositing a metal layer above the silicon layer to form a stack of layers comprising the silicon layer and the metal layer; and
thermally treating, by rapid thermal processing, the stack of layers to form a metal silicide layer.

17. The method according to claim 16, wherein the SiC substrate is a 4H—SiC semiconductor substrate or a 6H-SiC semiconductor substrate.

18. The method according to claim 16, wherein the polycrystalline SiC layer comprises 3C—SiC polytype.

19. The method according to claim 16, comprising:
before the depositing the metal layer, implanting doping atoms in a surface region of at least one of the SiC substrate, the polycrystalline SiC layer, the silicon layer, or the further silicon layer.

20. The method according to claim 16, wherein metal silicide of the metal silicide layer comprises metal of the metal layer and silicon of the silicon layer.

* * * * *